(12) United States Patent
McCurdy et al.

(10) Patent No.: US 6,664,813 B2
(45) Date of Patent: Dec. 16, 2003

(54) PSEUDO-NMOS LOGIC HAVING A FEEDBACK CONTROLLER

(75) Inventors: Michael A McCurdy, Fort Collins, CO (US); Edward Chang, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/100,781

(22) Filed: Mar. 19, 2002

(65) Prior Publication Data

US 2003/0179013 A1 Sep. 25, 2003

(51) Int. Cl.[7] .......................................... H03K 19/094
(52) U.S. Cl. ...................................... 326/121; 326/119
(58) Field of Search .............................. 326/93–98, 112, 326/119, 121

(56) References Cited

U.S. PATENT DOCUMENTS

| | | | | | |
|---|---|---|---|---|---|
| 5,831,452 | A | * | 11/1998 | Nowak et al. | 326/98 |
| 6,060,910 | A | * | 5/2000 | Inui | 326/98 |
| 6,130,559 | A | * | 10/2000 | Balsara et al. | 326/121 |
| 6,172,529 | B1 | * | 1/2001 | Klim et al. | 326/98 |
| 6,201,415 | B1 | * | 3/2001 | Manglore | 326/98 |
| 6,208,907 | B1 | * | 3/2001 | Durham et al. | 700/121 |
| 6,466,057 | B1 | * | 10/2002 | Naffziger | 326/121 |

* cited by examiner

*Primary Examiner*—Don Le

(57) ABSTRACT

A pseudo-NMOS circuit includes a load PFET electrically connected between a power supply and an output node, and an NFET circuit having a plurality of inputs connected between the output node and ground. A feedback PFET is electrically connected between the power supply and the output node, in parallel with the load PFET, and is controlled by a signal at the output node of the pseudo-NMOS circuit.

6 Claims, 2 Drawing Sheets

PSEUDO-NMOS LOGIC HAVING A FEEDBACK CONTROLLER

FIELD OF INVENTION

The present invention generally relates to CMOS logic circuits, and more particularly to a pseudo-NMOS logic circuit with numerous inputs.

BACKGROUND

A pseudo-NMOS logic implemented in a CMOS circuit typically includes a load PFET (PMOS) with its gate tied to ground (GND), so that the load PFET is always ON. The source and the drain of the load PFET are connected between the supply voltage (VDD) and a "pulldown" NFET tree or circuit, respectively. A typical conventional pseudo-NMOS logic implemented in a CMOS circuit is shown in FIG. 3, where Z is the output node of the pseudo-NMOS logic. The pulldown NFET tree implements the desired equations of the pseudo-NMOS logic. A conventional pseudo-NMOS logic implementing a NOR equation, for example, is shown in FIG. 4.

In a wide "fan-in" implementation of the pseudo-NMOS logic having numerous inputs to the pulldown tree, such as the NOR circuit shown in FIG. 4, "leakage" in the NFETs of the pulldown tree becomes a problem when the output at the node Z is high. A leakage occurs when there is undesirable current flow from source to drain even when the input voltage to the NFETs is zero or near zero. In other words, the NFETs do not act as a perfect switch. Power differential or noise at the inputs to the NFETs exacerbates the leakage problem, which results in noise being transmitted to other circuits that are connected to the output node Z of the pseudo-NMOS circuit.

The size (i.e., the width) of the load PFET can be increased to counter input noise and NFET leakage. In this manner the PFET becomes stronger (i.e., able to drive more current) so that there is less impact on the PFET by the leakage. However, this approach undesirably increases the voltage output level (VOL) when the NFETs are turned ON to produce a logical LOW value at the output Z. Alternatively, the size of the NFETs can be decreased. However, this method also results in increasing VOL.

SUMMARY OF THE INVENTION

In accordance with one embodiment of the present invention, a pseudo-NMOS circuit includes a first PFET electrically connected between a power supply and an output node. An NFET circuit is connected between the output node and ground and has a plurality of inputs. A second PFET is electrically connected between the power supply and the output node, and has a gate which is controlled by a signal at the output node.

DETAILED DESCRIPTION OF THE INVENTION

Figure 1:
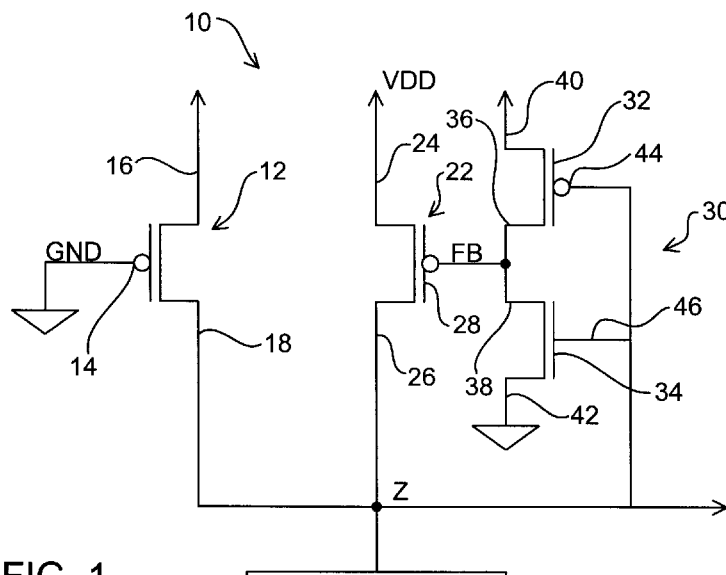
FIG. 1 is a circuit diagram of a pseudo-NMOS logic circuit in accordance with one embodiment of the present invention.

Turning now to FIG. 1, a pseudo-NMOS circuit in accordance with one embodiment of the present invention is indicated generally at 10 and includes a load PFET (or PMOS) 12 having a gate 14 tied to ground (GND) so that the PFET is always ON. A source 16 of the load PFET 12 is connected to the supply voltage (VDD), and a drain 18 is connected to a "pulldown" NFET tree or circuit 20 at an output node Z of the pseudo-NMOS circuit 10. The NFET tree 20 is also connected to ground GND. The NFET tree 20 implements the desired equation of the pseudo-NMOS logic 10 and produces the result at the output node Z.

A feedback PFET (or PMOS) 22 is also connected between VDD and the NFET tree 20, parallel to the load PFET 12. A source 24 and a drain 26 of the feedback PFET 22 are connected respectively to VDD and the output node Z, as with the load PFET 12. A gate 28 of the feedback PFET 22, however, is connected to an output node FB of an inverter circuit 30.

The inverter circuit 30 includes a PFET (or PMOS) 32 connected to an NFET (or NMOS) 34, with a drain 36 of the PFET 32 connected to a drain 38 of the NFET 34 at the output node FB. A source 40 of the PFET 32 is connected to VDD, and a source 42 of NFET 34 is connected to GND. Gates 44, 46 of PFET 32 and NFET 34, respectively, are both commonly connected to the output node Z.

Figure 2:
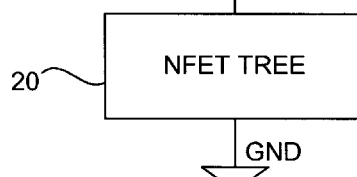
FIG. 2 is the pseudo-NMOS logic circuit of FIG. 1 implementing a large high fan-in input NOR gate.
Figure 2:
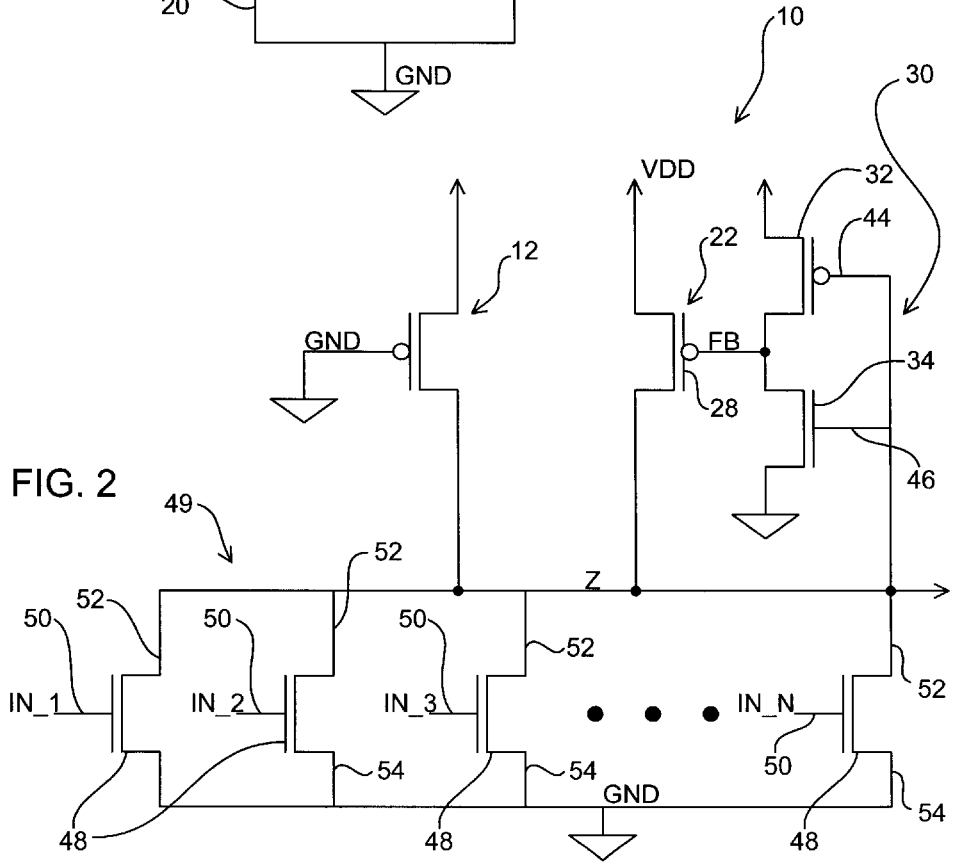
Figure 3:
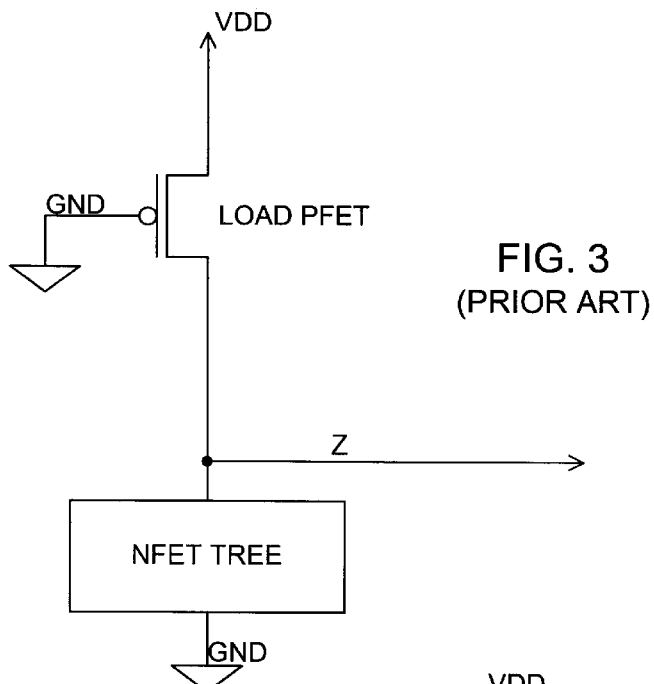
FIG. 3 is a conventional pseudo-NMOS logic circuit.
Figure 4:
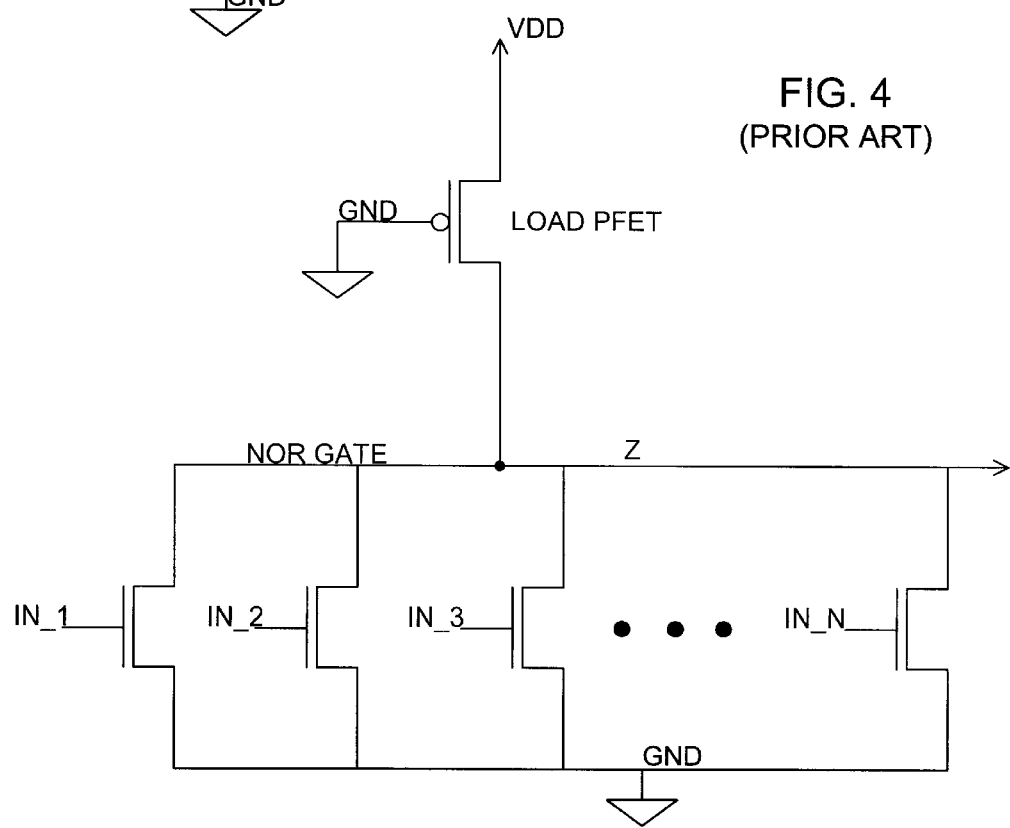
FIG. 4 is a conventional pseudo-NMOS logic circuit of FIG. 3 implementing a high fan-in input NOR gate.

Turning now to FIG. 2, the NFET tree 20 is shown implementing a NOR gate 49, for example, having a plurality of inputs IN_1 to IN_N for corresponding NFETs 48 that make up the NOR gate. The NFETs 48 are connected in parallel to each other with their gates 50 tied to the corresponding inputs IN_1 to IN_N. Drains 52 of the NFETs 48 are all connected to the output node Z, and sources 54 are connected to GND.

In operation, when all inputs IN_1 to IN_N transition LOW, voltage at the output node Z rises due to the load PFET 12 conducting current. As the output Z goes HIGH (a logical 1), the inverter circuit 30 outputs a LOW at the node FB, since the gates 44, 46 of the PFET 32 and NFET 34 are connected to the output node Z. As a result, the feedback PFET 22 (the gate 28 of which is connected to the output node FB) turns ON, thereby aiding in the transition of the output node Z to HIGH. In this manner, the feedback PFET 22 helps to maintain VOH (i.e., the voltage output level at the output node Z) when the NFETs 48 of the NOR gate 49 are turned OFF to produce a logical HIGH value in the presence of input noise or GND differentials on the inputs of the NOR gate NFETS.

As one or more of the inputs IN_1 to IN_N to the NFETs 48 transitions HIGH, the output node Z transitions to a LOW voltage (a logical zero). The load PFET 12 continues to conduct current, since its gate 14 is tied to GND. Initially, the feedback PFET 22 will also conduct current. However, as the output node Z transitions LOW past the trip point of the feedback inverter 30, the node FB goes HIGH. This causes the feedback PFET 22 to turn OFF. Those skilled in the art will recognize that the P-N ratio resulting from the sizing of the PFET 32 relative to the NFET 34 of the feedback inverter 30 determines how quickly the feedback PFET will turn OFF. Turning OFF the feedback PFET 22 allows the output node Z transition going LOW to occur faster, since the pulldown NFET tree 20 (i.e., the NOR gate 49 in the example above) does not have to "fight" with the feedback PFET 22 in an attempt to pull the output to GND. With the feedback PFET 22 turned OFF, VOL decreases thereby improving the noise margin (i.e., the range of input voltage that is interpreted as being a logical LOW) of a circuit (not shown) that receives its input from the output node Z.

From the foregoing description, it should be understood that an improved circuit topology of a pseudo-NMOS logic has been shown and described which has many desirable attributes and advantages. In accordance with one embodiment, a second PFET is connected in parallel to the load PFET and controlled via a feedback signal from the output of the pseudo-NMOS circuit. This arrangement results in improved input/output noise margin and reduced power consumption.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A pseudo-NMOS circuit comprising:

a first PFET electrically connected between a power supply and an output node;

an NFET circuit connected between said output node and ground and having a plurality of inputs;

a second PFET electrically connected between said power supply and said output node, said second PFET being controlled by a signal at said output node;

a control circuit for turning said second PFET ON and OFF based on said signal at said output node;

wherein said control circuit sets said second PFET to ON when said signal at said output node is HIGH, and sets said second PFET to OFF when said signal at said output node is LOW;

wherein a gate of said first PFET is connected to said ground, and a gate of said second PFET is connected to a feedback signal from said output node.

2. The circuit as defined in claim 1 wherein said second PFET is turned ON when a signal at said output node is HIGH, and turned OFF when said signal at said output node is LOW.

3. The circuit as defined in claim 1 wherein said control circuit is electrically connected between said power supply and said ground, and has an input connected to said output node.

4. The circuit as defined in claim 3 wherein said control circuit is an inverter circuit including a PFET connected in series to an NFET, and wherein said PFET is electrically connected to said power supply, said NEET is connected to said ground, and gates of said PEET and NFET are connected to said output node.

5. The circuit as defined in claim 4 wherein a gate to said second PEET is connected to a feedback node connecting a drain of said PEET and a drain of said NFET of said inverter circuit.

6. The circuit as defined in claim 5 wherein a signal at said feedback node transitions LOW to turn ON said second PFET when said signal at said output node is HIGH, and said signal at said feedback node transitions HIGH to turn OFF said second PFET when said signal at said output node is LOW.

* * * * *